(12) United States Patent
Stephens et al.

(10) Patent No.: US 9,472,455 B2
(45) Date of Patent: Oct. 18, 2016

(54) METHODS OF CROSS-COUPLING LINE SEGMENTS ON A WAFER

(71) Applicant: GLOBALFOUNDRIES Inc., Grand Cayman (KY)

(72) Inventors: Jason E. Stephens, Albany, NY (US); Lei Yuan, Cupertino, CA (US); Lixia Lei, Clifton Park, NY (US); David Pritchard, Glenville, NY (US); Tuhin Guha Neogi, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 61 days.

(21) Appl. No.: 14/246,197

(22) Filed: Apr. 7, 2014

(65) Prior Publication Data

US 2015/0287604 A1    Oct. 8, 2015

(51) Int. Cl.
    *H01L 21/28*    (2006.01)
    *H01L 21/768*    (2006.01)
    *H01L 21/8234*    (2006.01)
    *H01L 27/02*    (2006.01)

(52) U.S. Cl.
    CPC . *H01L 21/76895* (2013.01); *H01L 21/823431* (2013.01); *H01L 21/823475* (2013.01); *H01L 27/0207* (2013.01)

(58) Field of Classification Search
None
See application file for complete search history.

(56) References Cited

U.S. PATENT DOCUMENTS

| 8,018,070 B2 | 9/2011 | Blawid et al. |
| 2009/0057743 A1 | 3/2009 | Olligs et al. |
| 2009/0087754 A1* | 4/2009 | Aton .................. G03F 1/26 |
| | | 430/5 |

OTHER PUBLICATIONS

Dae Han Choi et al., "Mask Formation Processing", U.S. Appl. No. 13/940,535, filed Jul. 12, 2013 (24 pages).
Xiang Hu et al., "Facilitating Mask Pattern Formation", U.S. Appl. No. 14/076,386, filed Nov. 11, 2013 (26 pages).
David Pritchard et al., "Forming Cross-Coupled Line Segments", U.S. Appl. No. 14/167,071, filed Jan. 29, 2014 (18 pages).

* cited by examiner

*Primary Examiner* — Alexander Ghyka
(74) *Attorney, Agent, or Firm* — Heslin Rothenberg Farley & Mesiti P.C.; Kristian E. Ziegler

(57) ABSTRACT

A method is provided for fabricating cross-coupled line segments on a wafer for use, for instance, in fabricating cross-coupled gates of two or more transistors. The fabricating includes: patterning a first line segment with a first side projection using a first mask; and patterning a second line segment with a second side projection using a second mask. The second line segment is offset from the first line segment, and the patterned second side projection overlies the patterned first side projection, and facilitates defining a cross-stitch segment connecting the first and second line segments. The method further includes selectively cutting the first and second line segments in defining the cross-coupled line segments from the first and second line segments and the cross-stitch segment.

20 Claims, 7 Drawing Sheets

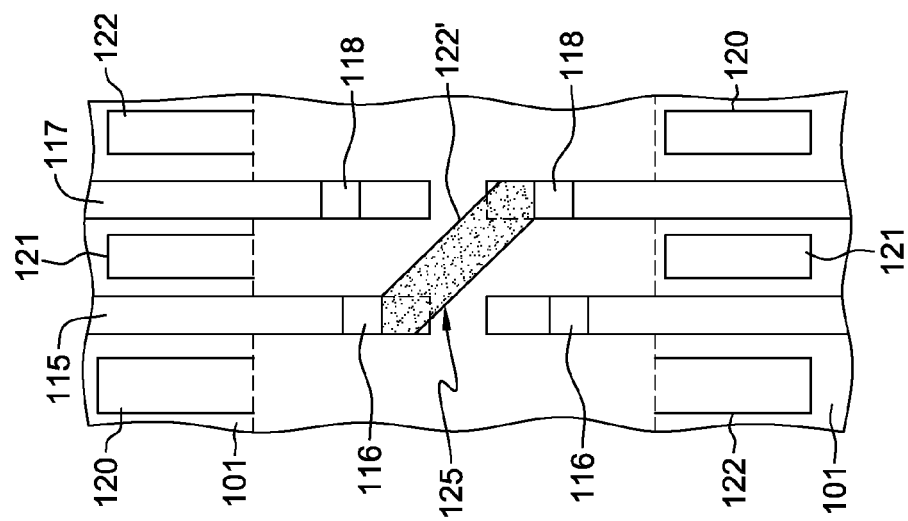
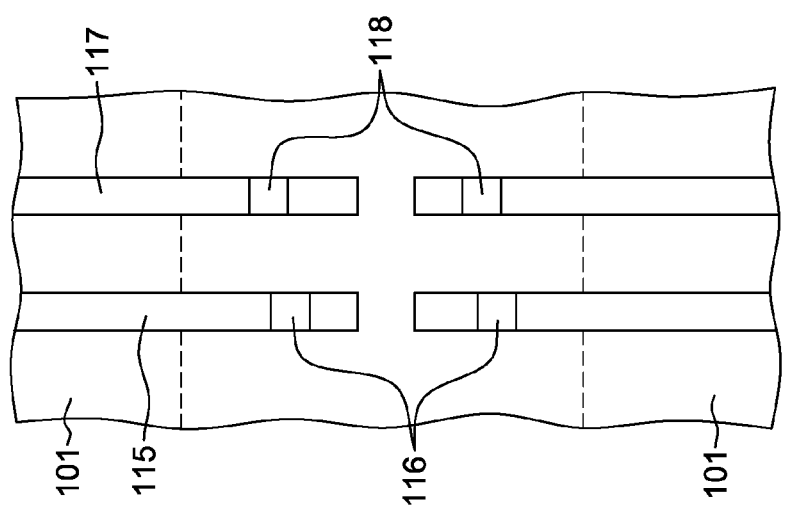
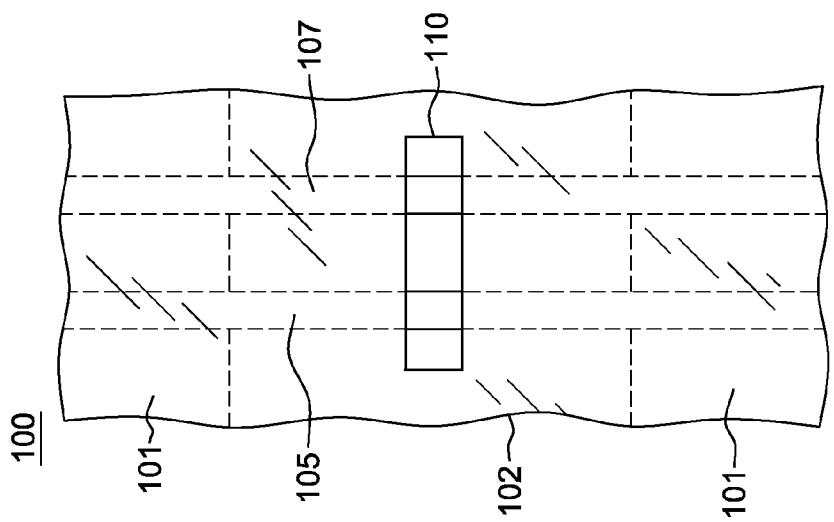

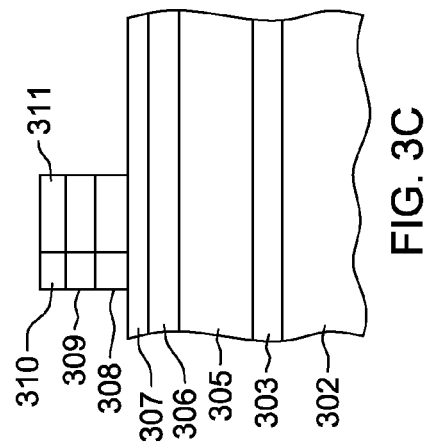
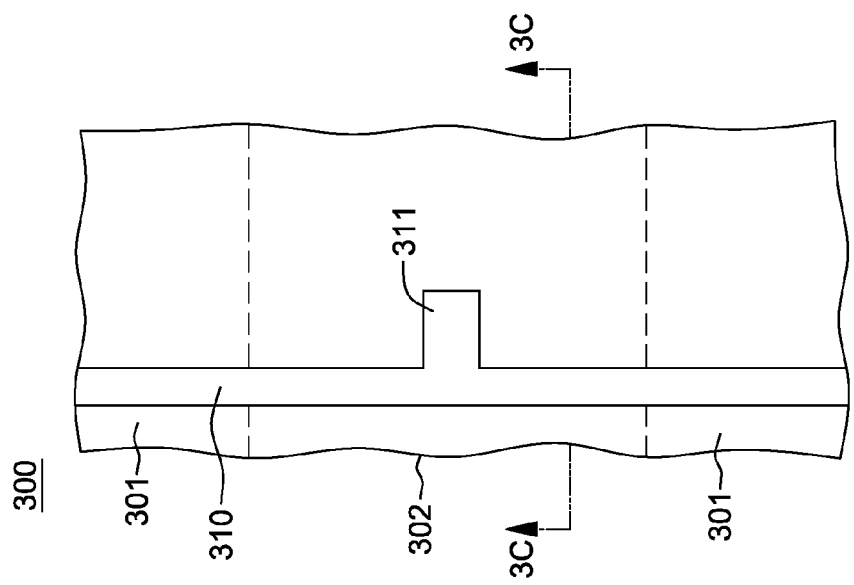
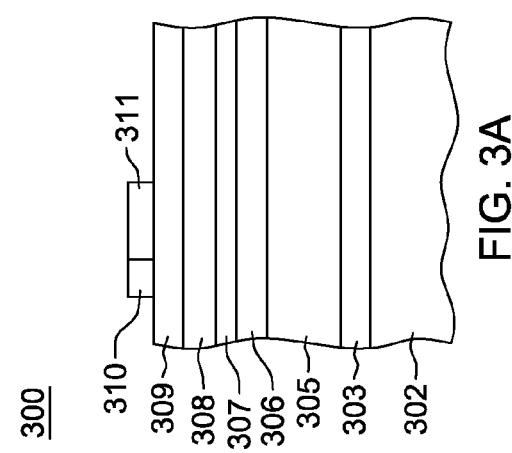

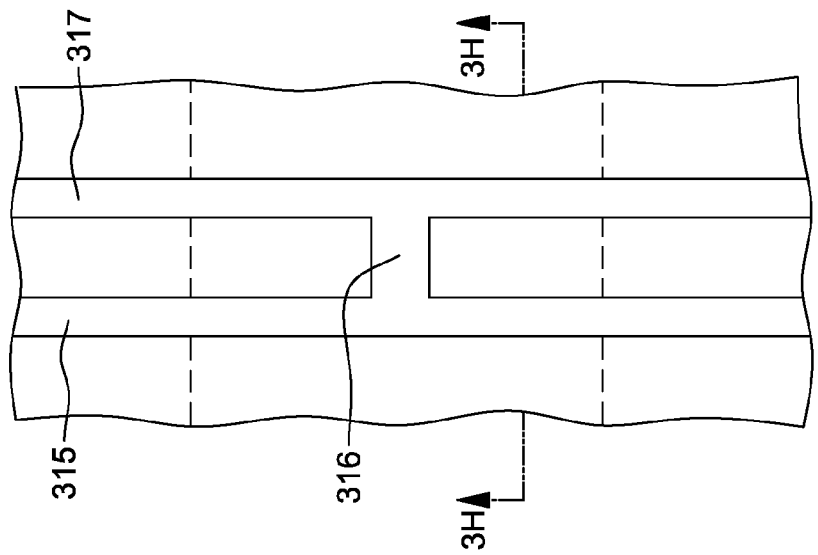
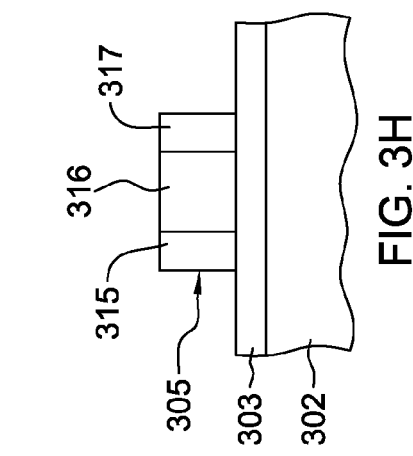
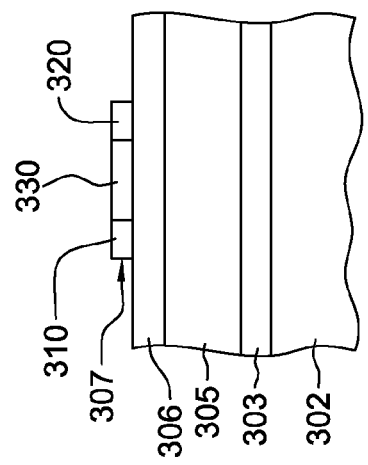

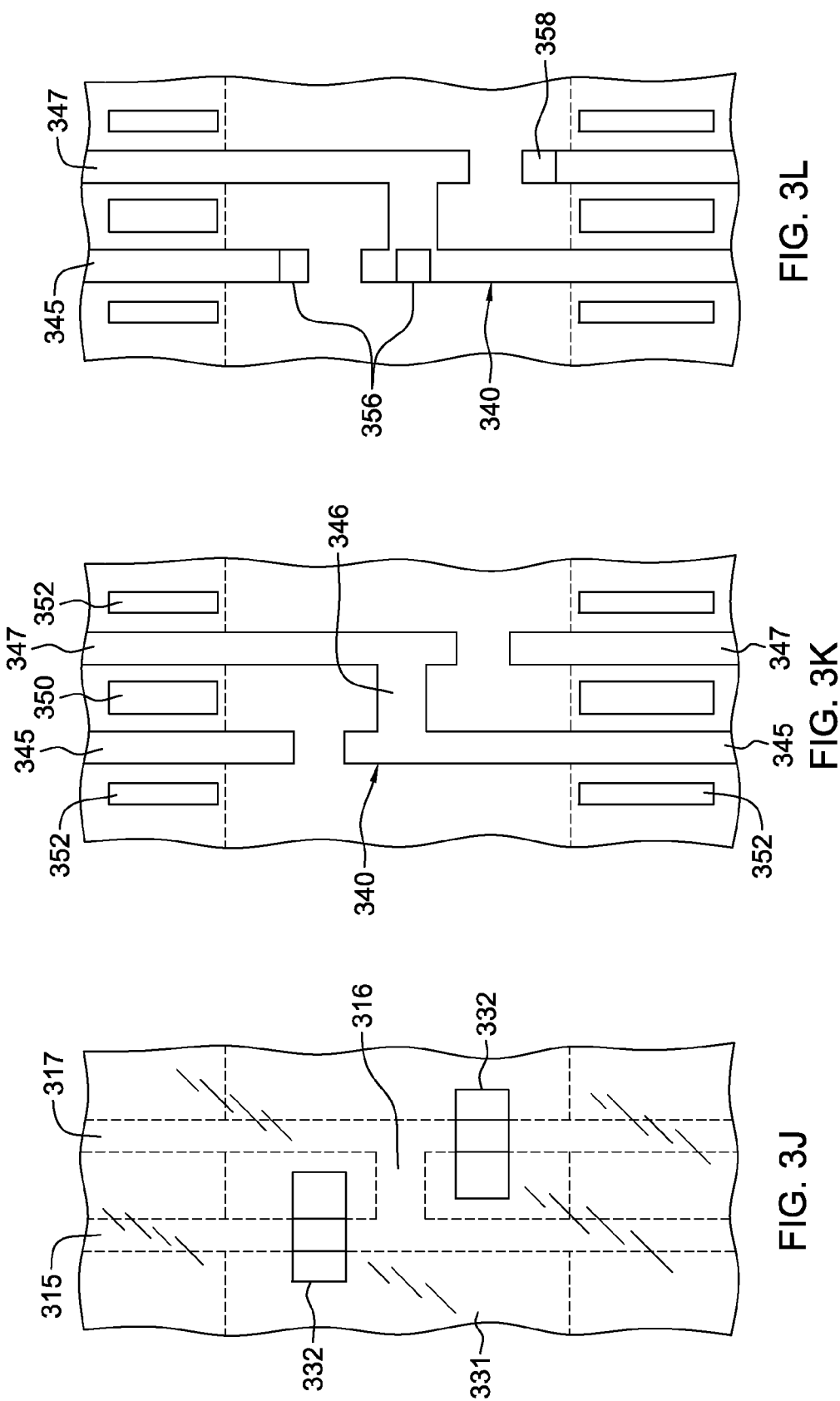

METHODS OF CROSS-COUPLING LINE SEGMENTS ON A WAFER

BACKGROUND OF THE INVENTION

The present invention relates in general to semiconductor devices and to methods of fabricating semiconductor devices, and more particularly, to methods of fabricating cross-coupled line segments for use, for instance, in fabricating of one or more semiconductor devices.

As is known, semiconductor device fabrication typically involves the process of transferring a mask pattern to a wafer using an etching to remove unwanted material, for instance, to facilitate forming fin structures and/or gate structures of fin-type field-effect transistors (FinFETs) or to facilitate forming field-effect transistors (FETs) in general. This process is generally referred to as lithographic processing. As the size of technology nodes continues to decrease, significant challenges continue to arise due (in part) to issues related to traditional lithographic processing techniques, including issues related to mask formation.

SUMMARY

The shortcomings of the prior art are overcome, and additional advantages are provided through the provision, in one aspect, of a method which includes, for instance: fabricating a structure including cross-coupled line segments on a wafer, the fabricating including: patterning a first line segment with a first side projection therefrom using a first mask; patterning a second line segment with a second side projection therefrom using a second mask, the second line segment being offset from the first line segment, and the patterned second side projection overlying the patterned first side projection and facilitating defining a cross-stitch segment connecting the first and second line segments; and selectively cutting the first and second line segments to define the cross-coupled line segments from the first and second line segments and the cross-stitch segment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 1A-1C depict one example of a middle-of-line process for fabricating cross-coupled gates of a plurality of transistors, in accordance with one or more aspects of the present invention;

FIGS. 3A-3L depict one embodiment of a gate-level process for fabricating an in situ mask structure including cross-coupled line segments, and the use thereof in fabricating cross-coupled gates of a plurality of transistors, in accordance with one or more aspects of the present invention.

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Further, note that the drawings referred to below are not drawn to scale for ease of understanding, and the same reference numbers used throughout different figures designate the same or similar elements.

In one aspect, circuit or device fabrication may involve using, for instance, lithography processing to facilitate transferring a mask pattern to one or more layers of a semiconductor wafer, which typically includes etching the wafer using the pattern to remove unwanted material. Lithography and etch processes may be used, for instance, to facilitate forming circuit features such as gate structures, fin structures, etc.

Figure 2:
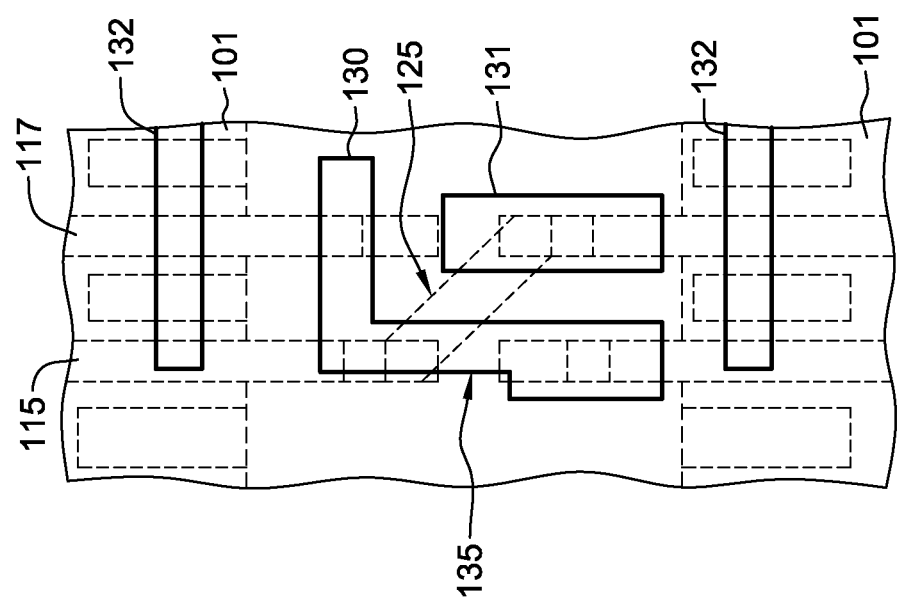
FIG. 2 depicts one example of a resultant circuit structure, with adjacent gates cross-coupled via a middle-of-line, bridging electrical contact extending between the adjacent gates, and a back-end-of-line, bridging metal line interconnecting electrical contacts of the adjacent gates, in accordance with one or more aspects of the present invention.

One circuit structure or cell design of interest is a structure having cross-coupled gates electrically connected across the pitch. Competitive standard cell designs for complementary metal oxide semiconductor (CMOS) devices often use such a circuit cross-couple. The manufacturability and cost of a circuit technology often relate to the robustness of a cross-coupled structure and a number of masks required to make the structure. FIG. 2 depicts one example of a cross-coupled gate structure, and a method of fabrication thereof is partially illustrated in FIGS. 1A-1C. In this approach, middle-of-line (MOL) contact layers, as well as a back-end-of-line metallization layer, are used to make the cross-couple.

Referring to FIG. 1A, one embodiment of an intermediate structure 100 is depicted, which includes a substrate 102, such as a semiconductor substrate (for instance, a silicon wafer), with parallel-extending, adjacent line segments 105, 107, which facilitate formation of adjacent gates 115, 117 (see FIG. 1B) of a plurality of transistors formed, for instance, in multiple active device regions 101 of the circuit structure. One or more layers may be disposed over substrate 102, including (for instance) a protective substrate layer and a sacrificial gate layer disposed over the protective substrate layer within which line segments 105, 107 may have been defined.

In one embodiment, line segments 105, 107 are fabricated of a sacrificial gate material, such as polysilicon, amorphous-carbon, or any conventional organic material, which as understood in the art, may be employed to hold position or form spacings for, for instance, adjacent gates to be fabricated via, for instance, a conventional gate-last or replacement metal gate process. The adjacent line segments may be obtained by selectively, anisotropically etching, for instance, underlying polysilicon on or part of substrate 102 to define adjacent polysilicon lines as part of a replacement metal gate process flow. The layers of structure 100 may be formed using a variety of different materials and fabrication techniques, such as chemical-vapor deposition (CVD), atomic layer deposition (ALD), physical-vapor deposition (PVD), or plasma-enhanced versions of such processes. The thicknesses of the layers may also vary, depending on the particular application.

Overlying structure 100 in FIG. 1A is, for instance, a cut mask with an opening 110 configured and sized to the desired width of the openings to be formed in the respective line segments 105, 107 exposed through opening 110. As one example, the cut mask may be defined in any conventional resist material disposed over the structure.

FIG. 1B illustrates a resultant structure with the line segments 105, 107 having been replaced with, for instance, replacement metal gates 115, 117, each with a transverse gap separating the gate into first and second gate segments. After final gates 115, 117 have been formed, electrical contacts 116, 118 may be formed to the respective gate segments using, for instance, two gate contact masks due to the close pitch of the adjacent gate segments.

In this cross-couple process flow, selected gate segments of the first and second gates 115, 117 are electrically connected using a middle-of-line (MOL) process integration, wherein multiple contact masks are employed in providing source and drain contacts 120, 121, 122, as well as a bridging contact 122' formed between electrical contacts 116, 118 to two gate segments of the adjacent gates 115, 117, as illustrated in FIG. 1C. Bridging contact 122', provided as illustrated in FIG. 1C, produces cross-coupled gates 125 from respective gate segments of the adjacent gates 115, 117, and the electrical contacts 116, 118 thereto.

As illustrated in FIG. 2, in addition to the above-noted middle-of-line electrical bridging 122' between gate segments of the adjacent gates 115, 117, back end of line metallization, such as metal one level metallization 130, 131, 132, may be employed in completing the cross-couple 135 by electrically interconnecting the remaining illustrated electrical contacts 116, 118 to the two remaining gate segments of the adjacent gates 115, 117.

One difficulty with the above-described middle-of-line and back-end-of-line approach to producing the structure of FIG. 2 is that additional mask layers are needed to develop the cross-couple in the middle-of-line processing, which significantly increases complexity and congestion of the cell design at the middle-of-line and back-end-of-line levels, potentially causing manufacturing difficulties. In fact, manufacturability and cost of a technology design may be highly dependent on the robustness of the cross-couple, and the number of masks required to implement a cross-coupling of lines, such as gate lines.

Figure 3F:
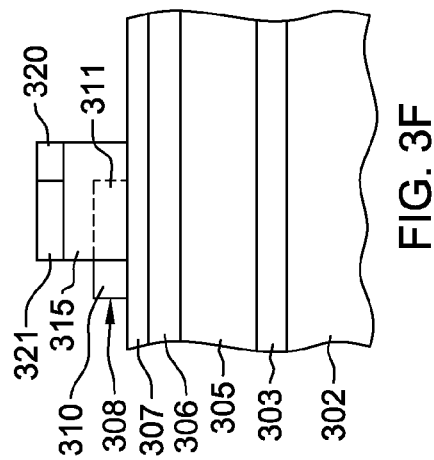
Figure 3E:
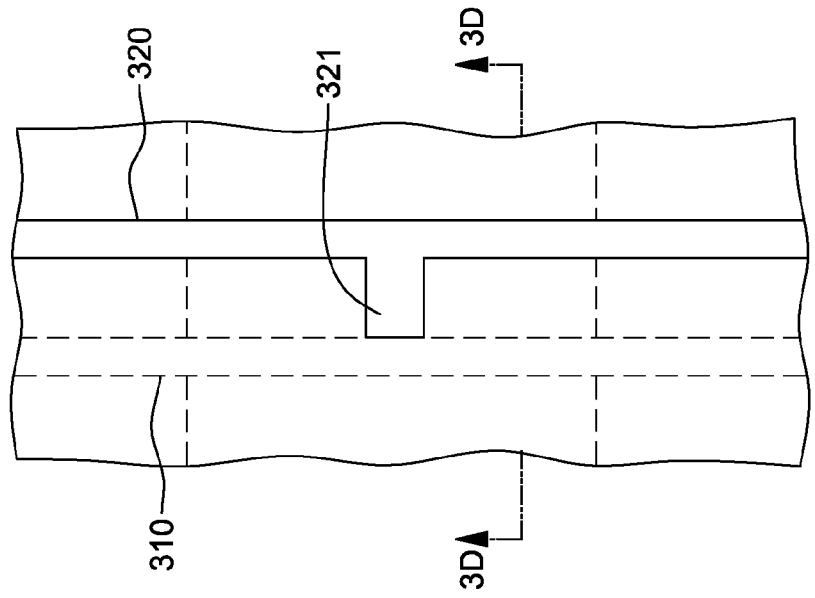
Figure 3D:
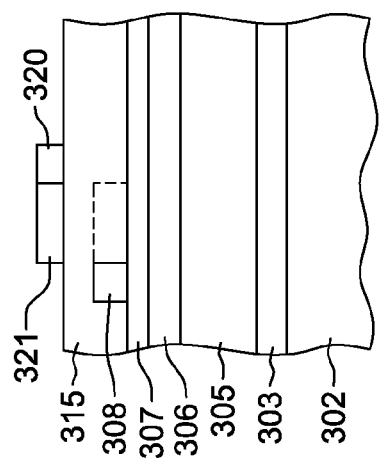
Figure 4:
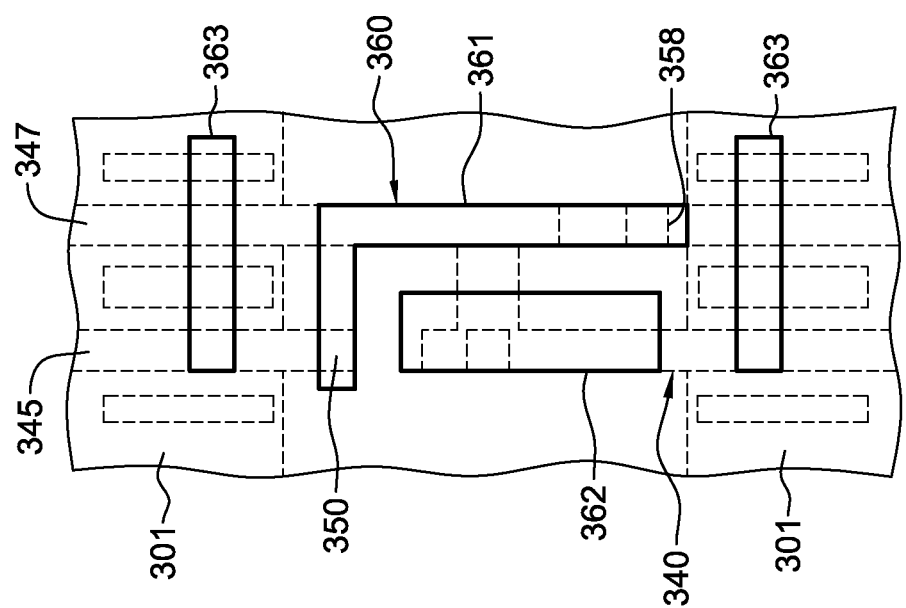
FIG. 4 depicts one example of a resultant circuit structure, with adjacent gates cross-coupled via the gate structures themselves and a single back-end-of-line, bridging metal line interconnecting electrical contacts of the adjacent gates, in accordance with one or more aspects of the present invention.

Disclosed herein below with reference to FIGS. 3A-4 is a novel approach to fabrication of a cross-couple structure, which significantly reduces complexity and congestion in the middle of the line contact levels, and in turn reduces complexity and congestion through back end of line levels. By reducing complexity and congestion in the middle of the line, the approach disclosed herein reduces the number of masks required, thereby making the cross-couple fabrication approach more cost competitive than other approaches, such as the above-described middle-of-line approach.

FIGS. 3A-3J depict one front end of line example for forming cross-coupled line segments, for instance, as sacrificial gate structures used during fabrication of one or more semiconductor devices. Beginning with FIG. 3A, a partial elevational, cross-sectional view of one embodiment of an intermediate structure 300 is depicted. Intermediate structure 300 includes a substrate 302, such as a semiconductor substrate (for instance a silicon substrate), and multiple layers disposed over substrate 302. The multiple layers may include, for instance, a protective substrate mask layer 303, a sacrificial gate layer 305, one or more hard mask layers 306, a second hard mask layer 307 below a first hard mask layer 308, an anti-reflective coating (ARC) 309 and patterned resist including a patterned first line segment 310 with a patterned first side projection 311 therefrom.

The layers of the structure of FIG. 3A may be formed using a variety of different materials and fabrication techniques, such as chemical-vapor deposition (CVD), atomic layer deposition (ALD), physical vapor deposition (PVD), or plasma enhanced versions of such processes. Further the thicknesses of the depicted layers may vary, depending on the particular application.

In one embodiment, substrate 302 may be a bulk semiconductor material such as, for example, a bulk silicon wafer. In another embodiment, substrate 302 may be any silicon-containing substrate including, but not limited to, a substrate fabricated of or including silicon (Si), single crystal silicon, polycrystalline Si, amorphous Si, silicon-on-nothing (SON), silicon-on-insulator (SOI), or silicon-on-replacement insulator (SRI) or the like. Substrate 302 may in addition or instead include various isolations, dopings and/or device features. For instance, the substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

As one specific example, protective substrate mask layer 303 may be a layer of silicon nitride, formed over a silicon substrate 302. By way of example, protective substrate mask layer 303, which may be deposited over silicon substrate 302 using any conventional deposition processes such as CVD, PVD or ALD, may be provided to protect the silicon substrate from damage during subsequent etch processes, and depending on the fabrication process, may also prevent semiconductor substrate 302 from being oxidized by exposure to an oxygen-containing environment. In another example, protective substrate mask layer 303 may include or be fabricated of nitride material such as, silicon oxynitride (SiON). Sacrificial gate layer 305 may be an amorphous silicon (a-Si) or a polysilicon material, which as understood in the art, may be employed to hold the gate positions for, for instance, the replacement metal gates to be formed. The one or more hard masks 306 may comprise, for instance, one or more layers of silicon nitride, silicon oxide, amorphous carbon, spin-on organic material, silicon carbon nitride (SiCN) etc. deposited over sacrificial gate layer 305. By way of further example, second hard mask layer 307 may be a layer of amorphous silicon (a-Si) formed with a desired thickness, and first hard mask layer 308 may be tetraethyl orthosilicate (TEOS) layer formed, for instance, by CVD processing to a desired thickness, for instance, 10 nm.

In one embodiment, the optical dispersive layer (if present) may be provided using conventional deposition processes. As is known, such a layer functions to refract portions of light waves that pass through it, so as to provide greater accuracy in subsequent lithography processing. As one example, the optical dispersive layer may be any of those conventionally employed during a pattern transfer process, such as ODL 63 or HM8006. Anti-reflective coating layer 309 may be, for instance, a silicon anti-reflective coating layer (SiARC), which is deposited over the optical dispersive layer to minimize any pattern distortion due to reflections. Anti-reflective coating 309 may include materials having silicon and nitrogen, silicon and oxygen, or silicon, oxygen and nitrogen, or an organic polymer, or combinations thereof. In another example, anti-reflective coating layer 309 may include or be fabricated of, for instance, a bottom anti-reflective coating layer (BARC). In a specific example, the bottom anti-reflective coating layer (BARC) includes conventional inorganic coating materials such as titanium, titanium dioxide, titanium nitride, chromium oxide, carbon or α-silicon. In another example, anti-reflective coating layer 309 may also include a conventional organic coating material, such as a light-absorbent material, or a polymer material or combinations thereof. As is known, the patterned photoresist, which protects underlying layers in the direction of etching during the subsequent etch processing, may include, for instance, organic photoresist materials, non-organic materials, or combinations thereof.

As noted, FIG. 3A depicts one example of a structure undergoing gate line or polysilicon (PC) lithography patterning processing, in accordance with one or more aspects of the present invention. The photoresist has been patterned in this example with patterned first line segment(s) 310 and patterned first side projection(s) 311 therefrom, as illustrated, by way of example, in the top plan view of FIG. 3B. The patterned photoresist is (at least in part) a first in situ mask, which may be used to pattern the first line segment and first side projection into, for instance, first hard mask layer 308, as illustrated in the cross-sectional elevational view of FIG. 3C, taken along line 3C-3C of the plan view of FIG. 3B. By way of example, one or more etchings, such as one or more dry-etchings, may be performed to transfer the photoresist pattern 310, 311 to first hard mask layer 308, resulting in a structure such as depicted in FIG. 3C. Note that in this implementation, the first hard mask open etch process (es) extends through the anti-reflective coating 309, and any optical dispersive layer, as well as through the first hard mask layer 308 (e.g., a TEOS layer), stopping on the second hard mask layer 307. One or more first etch process operations may be utilized at this stage, including (for example) an anti-reflective coating open step, an optical dispersion layer open step, and one or more hard mask open steps. Note in this regard, that a single first hard mask layer 308 is illustrated by way of example only.

Subsequent to the above first lithography patterning and etching processes (depicted in FIGS. 3A-3C), second lithography patterning and etching processes are performed as illustrated (by way of example) in FIGS. 3D-3F. In this second patterning step, the first patterned photoresist 310, 311 and first anti-reflective coating 309 are removed from over the patterned first hard mask 308, and, for instance, a further optical dispersive layer (not shown), and a further anti-reflective coating 315 are deposited over the structure, after which lithography patterning is employed to pattern exposed resist with a patterned second line segment(s) 320 with a patterned second side projection(s) 321 therefrom. In one implementation, the patterned second line segment is spaced from, but disposed adjacent to the patterned first line segment, and the patterned second side protrusion overlies the first patterned side projection, as illustrated in FIG. 3D. By way of example, the second patterned side projection may be a mirror image of the first pattern side projection, disposed to align with and overlie the first pattern side projection, as illustrated in FIG. 3E.

One or more second etch processes are performed using the second lithography patterning of FIGS. 3D & 3E to, for instance, pattern the anti-reflective coating 315 over second hard mask 308, as illustrated in FIG. 3F. After etching anti-reflective coating 315, both patterned line segments 310, 320 and aligned side projections 311, 321 are transferred to the second hard mask layer 307, as illustrated in FIG. 3G. Note that the aligned patterned first and second side projections 311, 321 result in defining a cross stitch segment 330 within second hard mask layer 307, which connects the patterned first line segment 310 and patterned second line segment 320, thereby producing a further in situ mask within second hard mask layer 307. Note that this process may be repeated any number of times across the wafer to provide, for instance, a large number of adjacent parallel disposed gates with cross stitch segments connecting, for instance, desired line segments of multiple line segments formed on or within the wafer.

The in situ formed mask of FIG. 3G maybe then used in one or more further etching processes to define the first and second line segments 315, 317, and interconnecting cross stitch segment 316 in the one or more sacrificial gate layers 305, as shown in FIGS. 3H & 3I, where FIG. 3H is a cross-sectional elevational view of the plan depiction of FIG. 3I, taken along line 3H-3H thereof. The one or more further etch processes include processes to etch through the one or more hard masks 306 and the one or more sacrificial gate layer 305. These further etch processes are used to transfer the in situ formed mask from second hard mask layer 307 to the sacrificial gate layer(s) 305. Note that in this example, the further etch processing stops on the protective mask layer 303.

In FIG. 3J, a cut mask 331 has been patterned with openings 332 to facilitate cutting at desired locations the first and second line segments 315, 317 to define a cross-coupled line segment from the first and second line segments 315, 317 and cross-stitch segment 316. The resultant front-end-of-line, cross-coupled line segment of FIG. 3J, formed in the sacrificial gate material, may be employed in subsequent replacement metal gate processing to define a cross-coupled gate structure 340, such as illustrated in FIG. 3K. In this figure, the first and second line segments have been replaced by first and second gates 345, 347, respectively, and the cross-stitch segment has been replaced by a cross-stitch gate connection 346, interconnecting and co-planar with the first and second gates 345, 347. As noted, the first and second gates or gate segments of adjacent gates, pass over, for instance, multiple active regions 301 within which a plurality of transistors are to be formed. In the example depicted in FIGS. 3A-3K, the cross-stitch segment or cross-stitch gate connection is a rectangular-shaped interconnection between the first and second line segments or first and second gates. Advantageously, by defining the cross-coupled gates using the front end of line approach discussed above, fewer middle-of-line contact masks are required to make electrical contact to, for instance, the plurality of transistors of the circuit structure. In the embodiment of FIG. 3K, first and second contact masks are employed to make adjacent source and drain contacts 352, 350 to transistors in the active regions 301 of the circuit structure. Additionally, as illustrated in FIG. 3L, only two single gate contact masks need be employed to make electrical contact 356, 358 to the first and second gate segments 345, 347, and the cross-coupled gates 340.

FIG. 4 illustrates one embodiment of the resultant cross-coupled structure, where a metal one level interconnect 361 is employed to connect the remaining first gate and second gate segments 345, 347, and create a second-cross-coupled gate 360, to complete cross-coupling of the gate lines. As illustrated, due to the simplified middle-of-line gate contacts, pin accessibility is increased in the approach of FIGS. 3A-4. By reducing complexity and congestion in the middle-of-line level, and complexity and congestion in the back end of line level, the number of masks required is reduced, making future technology nodes more competitive, such as 10 nm nodes below. For instance, using the above-described first litho-etch, second litho-etch sacrificial gate processing, a single mask is added to the front-end-of-line sacrificial gate process flow, but one gate contact mask is removed, along with one source/drain contact mask, which advantageously reduces complexity of the design congestion.

To summarize, disclosed herein are methods for fabricating a structure which includes cross-coupled line segments, or cross-coupled gates on a wafer. The fabricating includes: patterning a first line segment with a first side projection therefrom using a first mask; patterning a second line segment with a second side projection therefrom using a second mask, the second line segment being offset from the first line segment, and the patterned second side projection overlying the patterned first side projection and facilitating defining a cross-stitch segment connecting the first and second line segments; and selectively cutting the first and second line segments in defining the cross-coupled line segments from the first and second line segments and the cross-stitch segment. In one implementation, a front-end-of-line, litho-etch process is employed to create an in situ mask, for instance, within one or more hard mask layers on the wafer, which may be transferred to a sacrificial gate layer of the wafer for use in a replacement metal gate process flow. Using this approach, adjacent gate lines may be cross-coupled at the gate-level using a co-planar interconnect stitch patterned within the sacrificial gate layer.

For instance, patterning the first line segment may include a first lithographic patterning of at least one first layer of a wafer to facilitate defining the first line segment with the first side projection therefrom on the wafer, and performing at least one first etching of the at least one first layer to pattern the first line segment with the first side projection therein. Patterning the second line segment may include a second lithographic patterning of at least one second layer provided on the wafer to facilitate defining the second line segment with the second side projection therefrom on the wafer, and performing at least one second etching of the at least one second layer to pattern the second line segment with the second side projection therein.

Fabricating the cross-coupled structure may also include at least one further etching to define the first and second line segments and the cross-stitch segment in at least one common layer of the wafer. By way of example, the at least one common layer of the wafer may include at least one sacrificial gate layer of the wafer, such as at least one sacrificial layer which facilitates forming gates of a plurality of transistors of a circuit structure using a replacement metal gate process. The selectively cutting the line segments may include selectively cutting the first and second line segments in the at least one common layer of the wafer in defining the cross-coupled line segments from the first and second line segments and the cross-stitch segment.

In one implementation, fabricating the cross-coupled structure includes defining the cross-stitch segment co-planar with the first and second line segments, within at least one common layer of the wafer, and the first side projection from the first line segment and the second side projection from the second line segment may be mirror image projections so as to align over the wafer. In one implementation, the cross-stitch segment has a transverse width which is larger than a transverse width of the first line segment or a transverse width of the second line segment. For instance, the cross-stitch segment may be a rectangular-shaped interconnection between the first and second line segments. In one embodiment, the cross-stitch segment extends orthogonal from the first line segment, and extends orthogonal from the second line segment. Advantageously, the fabricating may include forming a plurality of transistors, and the cross-coupled line segments facilitate forming cross-coupled gates of at least two transistors of the plurality of transistors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
  fabricating a structure comprising cross-coupled line segments on a wafer, the fabricating comprising:
    patterning a first line segment with a first side projection therefrom using a first mask;
    after pattering the first line segment, patterning a second line segment with a second side projection therefrom using a second mask, the second line segment being offset from the first line segment, and the patterned second side projection overlying the patterned first side projection and facilitating defining a cross-stitch segment connecting the first and second line segments; and selectively cutting the first and second line segments to define the cross-coupled line segments from the first and second line segments and the cross-stitch segment.

2. The method of claim 1, wherein patterning the first line segment comprises a first lithographic patterning of at least one first layer on the wafer to facilitate defining the first line segment with the first side projection therefrom on the wafer.

3. The method of claim 2, wherein patterning the first line segment comprises performing at least one first etching of the at least the first layer to pattern the first line segment with the first side projection therein.

4. The method of claim 3, wherein patterning the second line segment comprises a second lithographic patterning of at least one second layer on the wafer to facilitate defining the second line segment with the second side projection therefrom on the wafer.

5. The method of claim 4, wherein patterning the second line segment comprises performing at least one second etching of the at least one second layer to pattern the second line segment with the second side projection therein.

6. The method of claim 5, further comprising performing at least one further etch process to define the first and second line segments and the cross-stitch segment in at least one common layer on the wafer.

7. The method of claim 6, wherein the selectively cutting comprises selectively cutting the first and second line segments in the at least one common layer on the wafer in defining the cross-coupled line segments from the first and second line segments and the cross-stitch segment.

8. The method of claim 6, wherein the at least one common layer of the wafer comprises at least one sacrificial gate layer on the wafer, the at least one sacrificial gate layer facilitating forming sacrificial gates for a plurality of transistors of the structure.

9. The method of claim 1, wherein patterning the first line segment comprises a first lithographic patterning of at least one first layer on a wafer to facilitate defining the first line segment with the first side projection therefrom on the wafer, and patterning the second line segment comprises a second lithographic patterning of at least one second layer on the wafer to facilitate defining the second line segment with the second side projection therefrom on the wafer.

10. The method of claim 9, further comprising performing at least one further etch process to define the first and second line segments and the cross-stitch segment in at least one common layer on the wafer.

11. The method of claim 10, wherein the selectively cutting comprises selectively cutting the first and second line segments in the at least one common layer on the wafer in defining the cross-coupled line segments from the first and second line segments in the cross-stitch segment.

12. The method of claim 1, wherein the fabricating comprises providing the cross-stitch segment co-planar with the first and second line segments.

13. The method of claim 1, wherein the patterned first side projection from the first line segment and the patterned second side projection from the second line segment are mirror image projections.

14. The method of claim 1, wherein the cross-stitch segment has a transverse width larger than a transverse width of the first line segment or a transverse width of the second line segment.

15. The method of claim 1, wherein the cross-stitch segment is co-planar with, and a rectangular-shaped interconnection between, the first and second line segments.

16. The method of claim 1, wherein the cross-stitch segment extends orthogonal from the first line segment and extends orthogonal from the second line segment.

17. The method of claim 1, wherein the fabricating comprises etching the first line segment, the second line segment, and the cross-stitch segment into at least one common layer on the wafer.

18. The method of claim 17, wherein the at least one common layer of the wafer comprises a sacrificial gate layer.

19. The method of claim 17, wherein the selectively cutting comprises selectively cutting the first and second line segments in the at least one common layer on the wafer via at least one cut mask to define the cross-coupled line segments from the first and second line segments and the cross-stitch segment.

20. The method of claim 1, wherein the fabricating further comprises forming a plurality of transistors, and wherein the cross-coupled line segments facilitate forming cross-coupled gates of multiple transistors of the plurality of transistors.

* * * * *